(12) United States Patent
Choi et al.

(10) Patent No.: US 10,347,952 B2
(45) Date of Patent: Jul. 9, 2019

(54) BATTERY SYSTEM (71) Applicant: SAMSUNG SDI CO., LTD., Yongin-si, Gyeonggi-do (KR)

(72) Inventors: Jongrock Choi, Yongin-si (KR); Jeongkurn Park, Yongin-si (KR); Junyoung Kim, Yongin-si (KR); Cheolgi Son, Yongin-si (KR); Hwasu Kim, Yongin-si (KR); Sujun Park, Yongin-si (KR); Dongrak Kim, Yongin-si (KR); Kwangmin Yoo, Yongin-si (KR); Hyunjun Do, Yongin-si (KR); Inseob Song, Yongin-si (KR)

(73) Assignee: Samsung SDI Co., Ltd., Yongin-Si, Gyeonggi-do (KR)

(*) Notice: Subject to any disclaimer, the term of this patent is extended or adjusted under 35 U.S.C. 154(b) by 399 days.

(21) Appl. No.: 15/234,230

(22) Filed: Aug. 11, 2016

(65) Prior Publication Data
US 2017/0054134 A1 Feb. 23, 2017

(30) Foreign Application Priority Data
Aug. 20, 2015 (KR) .......... 10-2015-0117344

(51) Int. Cl.
*H01H 9/26* (2006.01)
*H01M 10/42* (2006.01)
(Continued)

(52) U.S. Cl.
CPC .......... *H01M 10/425* (2013.01); *G01R 31/36* (2013.01); *H01M 10/482* (2013.01); *H02J 7/0013* (2013.01); *H01M 2010/4271* (2013.01)

(58) Field of Classification Search
CPC .... H01M 10/00; H01M 10/02; H01M 10/425; H01M 10/482; H01M 10/4271;
(Continued)

(56) References Cited

U.S. PATENT DOCUMENTS 8,159,191 B2 * 4/2012 Chang ............... B60K 16/00
320/136
2008/0012529 A1 1/2008 Chang et al.
(Continued)

FOREIGN PATENT DOCUMENTS

JP 2014-506105 A 3/2014
KR 10-2006-0016455 A 2/2006
(Continued)

*Primary Examiner* — Anthony R Jimenez
(74) *Attorney, Agent, or Firm* — Lee & Morse, P.C.

(57) ABSTRACT

A battery system includes a first battery, a second battery, and a battery manager. The first battery is electrically connected between a first node and a second node via a first module switch in a short circuit state. The second battery is electrically insulated from the first battery by a second module switch in an open circuit state. The battery manager detects a first battery voltage of the first battery, a second battery voltage of the second battery, and a system current flowing between the first and second nodes, determines an open circuit voltage of the first battery based on the first battery voltage and the system current, and short-circuits the second module switch when the open circuit voltage is substantially equal to the second battery voltage so that the at least one second battery is connected to the at least one first battery in parallel.

17 Claims, 4 Drawing Sheets (51) Int. Cl.
*H01M 10/48* (2006.01)
*G01R 31/36* (2019.01)
*H02J 7/00* (2006.01)

(58) Field of Classification Search
CPC .. H01M 10/4278; H01M 10/48; H01M 10/63; H01M 10/651; H01M 2010/4271; H02J 7/0013; G01R 31/36
USPC .......................................................... 429/61
See application file for complete search history.

(56) References Cited

U.S. PATENT DOCUMENTS

| | | |
|---|---|---|
| 2010/0259221 A1* | 10/2010 | Tabatowski-Bush ........................ H02J 7/0021 320/134 |
| 2013/0234508 A1 | 9/2013 | Eisele et al. |
| 2014/0015477 A1 | 1/2014 | Tsai |
| 2015/0194707 A1 | 7/2015 | Park |
| 2015/0222117 A1 | 8/2015 | Im |

FOREIGN PATENT DOCUMENTS

| | | |
|---|---|---|
| KR | 10-2015-0081731 A | 7/2015 |
| KR | 10-2015-0091890 A | 8/2015 |

\* cited by examiner

BATTERY SYSTEM

CROSS-REFERENCE TO RELATED APPLICATION

Korean Patent Application No. 10-2015-0117344, filed on Aug. 20, 2015, and entitled, "Battery System," is incorporated by reference herein in its entirety.

BACKGROUND

1. Field

One or more embodiments described herein relate to a battery system.

2. Description of the Related Art

Battery systems are used in many fields and have varying capacities. A relatively large-capacity battery system may be formed by connecting a plurality of battery modules to one another in parallel. When battery modules are connected to one another in parallel, an in-rush current may be generated as a result of voltage differences among the battery modules. The in-rush current may cause the battery modules or an energy storage system to break or malfunction.

SUMMARY

In accordance with one or more embodiments, a battery system includes a first battery electrically connected between a first node and a second node via a first module switch in a short circuit state; a second battery electrically insulated from the first battery by a second module switch in an open circuit state; and a battery manager to detect a first battery voltage of the first battery, a second battery voltage of the second battery, and a system current flowing between the first and second nodes, to determine an open circuit voltage of the first battery based on the first battery voltage and the system current, and to short-circuit the second module switch when the open circuit voltage is substantially equal to the second battery voltage so that the at least one second battery is connected to the at least one first battery in parallel. The battery manager may connect the second battery to the first battery in parallel while the first battery is being charged or discharged.

When the first battery is being discharged, the battery manager may control the second module switch to short-circuit when the first battery voltage is lower than the second battery voltage by an estimated value. When the first battery is being charged, the battery manager may control the second module switch to short-circuit when the first battery voltage is higher than the second battery voltage by an estimated value.

The battery manager may store information corresponding to an internal resistance value of the first battery, and determine the estimated value to be a product of the system current and the internal resistance value of the first battery. The battery manager may estimate the open circuit voltage of the first battery based on an inclination of a variation in the first battery voltage with respect to a variation in the system current.

The battery system may include a system switch connected between the first node and an external terminal, wherein the battery manager is to open the system switch when a discharge current discharged from the first battery is greater than a discharge reference value and is to open the first module switch when a charge current introduced into the first battery is greater than a charge reference value.

In accordance with one or more other embodiments, a battery system includes a plurality of battery modules selectively connected to one another in parallel; and a system manager to manage the battery modules, wherein each of the battery modules includes: a module switch serially connected to a battery between a pair of module terminals, and a module manager to detect a battery voltage and a battery current of the battery, to transmit information corresponding to the battery voltage and the battery current to the system manager, and to switch the module switch under control of the system manager, and wherein the system manager is to determine a timing to short-circuit a module switch of at least one remaining second battery module from among the battery modules based on the battery voltage and the battery current of each of the battery modules, while at least one first battery module from among the battery modules is being charged or discharged.

The system manager may determine an open circuit voltage of the first battery module based on the battery voltage and the battery current of the first battery module, and transmit a switch short-circuit command to a module management unit of the second battery module when the open circuit voltage is substantially equal to the battery voltage of the second battery module.

The system manager may determine an internal resistance value of the first battery module based on a ratio of a variation in the battery voltage of the first battery module to a variation in the battery current of the first battery module, and determine the open circuit voltage of the first battery module based on the battery voltage, the battery current, and the internal resistance value of the first battery module.

While the first battery module is being discharged, the system manager may determine the open circuit voltage by adding a product of the battery current and the internal resistance value of the first battery module to the battery voltage of the first battery module, and while the first battery module is being charged, the system manager may determine the open circuit voltage by subtracting the product of the battery current and internal resistance value of the first battery module from the battery voltage of the first battery module.

The system manager may store information corresponding to a relationship between a state of charge (SOC) of the first battery module and the open circuit voltage of the first battery module, calculate the SOC of the first battery module by accumulating the battery current of the first battery module, and estimate the open circuit voltage of the first battery module based on the SOC of the first battery module.

In accordance with one or more other embodiments, an apparatus includes a detector to detect a first battery voltage of a first battery, a second battery voltage of a second battery, and current flowing between first and second nodes, the first battery connected between a first node and a second node when a first module switch is in a short circuit state, the second battery electrically insulated from the first battery when a second module switch in an open circuit state; and a battery manager to determine an open circuit voltage of the first battery based on the first battery voltage and the current and to short-circuit the second module switch when the open circuit voltage is substantially equal to the second battery voltage to connect the second battery to the first battery in parallel.

The battery manager may connect the second battery to the first battery in parallel while the first battery is being charged or discharged. The battery manager may control the second module switch to short-circuit when the first battery voltage is lower than the second battery voltage by an estimated value during a time when the first battery is being discharged.

The battery manager may control the second module switch to short-circuit when the first battery voltage is higher than the second battery voltage by an estimated value during a time when the first battery is being charged.

The battery manager may store information corresponding to an internal resistance value of the first battery, and determine the estimated value to be a product of the system current and the internal resistance value of the first battery.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
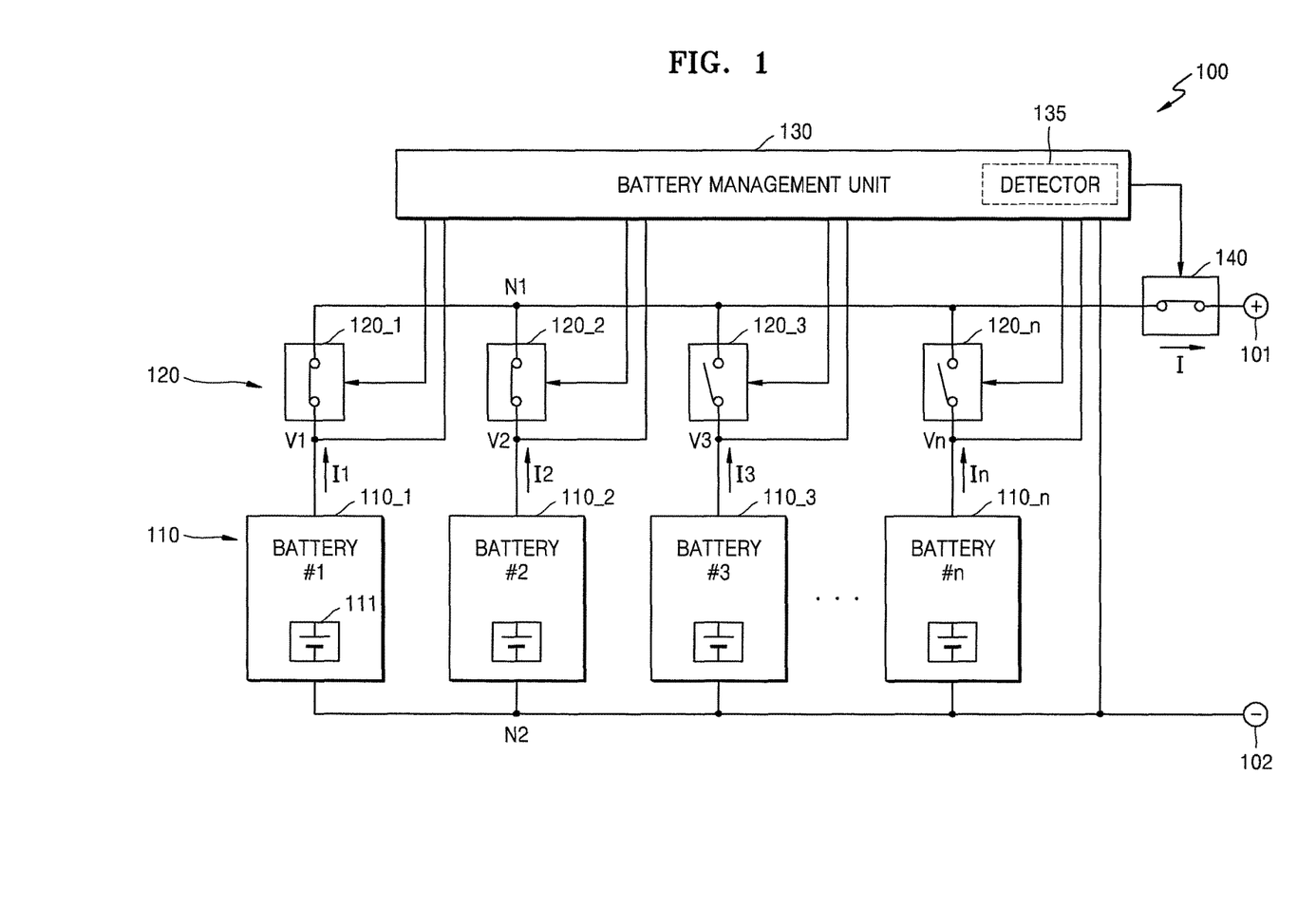
FIG. 1 illustrates an embodiment of a battery system.

FIG. 1 illustrates an embodiment of a battery system 100 which includes batteries 110, module switches 120, and a battery management unit 130. The batteries 110 include batteries 110_1 through 110_n that are selectively connected to one another in parallel. The module switches 120 include module switches 120_1 through 120_n that are serially connected to the batteries 110, respectively. The batteries 110 are selectively connected between a first node N1 and a second node N2 via the module switches 120.

The batteries 110 include at least one first battery (e.g., batteries 110_1 and 110_2) connected between the first node N1 and the second node N2 via at least one first module switch (e.g., module switches 120_1 and 120_2) in a short circuit state, and at least one second battery (e.g., the batteries 110_3 through 110_n) electrically insulated from the at least one first battery (e.g., the batteries 110_1 and 110_2) by at least one second module switch (e.g., the module switches 120_3 through 120_n) in an open circuit state.

FIG. 1 illustrates an example in which the module switches 120_1 and 120_2 are in a short circuit state and the module switches 120_3 through 120_n are in an open circuit state. Module switches (e.g., module switches 120_1 and 120_2) in a short circuit state are referred to as first module switches, and module switches (e.g., module switches 120_3 through 120_n) in an open circuit state may be referred to as second module switches. Batteries (e.g., batteries 110_1 and 110_2) connected between the first node N1 and the second node N2 by the first module switches in a short circuit state may be referred to as first batteries. Batteries (e.g., batteries 110_3 through 110_n) electrically insulated from the first batteries by the second module switches in an open circuit state may be referred to as second batteries.

The first batteries (e.g., batteries 110_1 and 110_2) are connected to each other in parallel, and may discharge currents toward an electric load connected to external terminals 101 and 102 or may be charged by a charging device connected to the external terminals 101 and 102. According to the states of the module switches 120, a first battery and a second battery, and a first module switch and a second module switch, may be conceptually defined.

In the illustrative example of FIG. 1, two module switches 120_1 and 120_2 are in a short circuit state. Also, all of the module switches 120 are may be an open circuit state before the battery system 100 operates, and all of the module switches 120 may be in a short circuit state in the end. The number of module switches in a short circuit state may be no more than n. The number of module switches in a short circuit state may be at least one to less than n in another embodiment.

The battery management unit 130 detects first battery voltages (e.g., battery voltages V1 and V2) of the first batteries (e.g., the batteries 110_1 and 110_2), second battery voltages (e.g., battery voltages V3-Vn) of the second batteries (e.g., batteries 110_3 through 110_n), and a system current I flowing between the first node N1 and the second node N2. The battery management unit 130 may include a detector 135 to detect these voltages.

The battery management unit 130 determines open circuit voltages of the first batteries (e.g., batteries 110_1 and 110_2) based on the first battery voltages (e.g., battery voltages V1 and V2) and the system current I. When the open circuit voltages become substantially equal to the second battery voltages (e.g., battery voltages V3-Vn), the battery management unit 130 short-circuits second module switches (e.g., the module switches 120_3 through 120_n) and connects the second batteries (e.g., the batteries 110_3 through 110_n) to the first batteries (e.g., the batteries 110_1 and 110_2) in parallel.

Each battery 110 includes at least one battery cell 111. In one embodiment, each battery 110 includes a plurality of battery cells 111. The battery cells 111 may be serially connected to one another, may be connected to one another in parallel, or may be connected to one another in a combination of serial and parallel arrangements. The number of battery cells 111 in each battery 110 may be determined, for example, according to a required output voltage.

The batteries 110 may be selectively connected to one another in parallel, and may be connected to a load and/or a charging device via the two external terminals 101 and 102. In one embodiment, the external terminals 101 and 102 may be connected to a bidirectional converter. The battery system 100 may supply electricity to the load via the bidirectional converter or may receive electricity from the charging device.

Each battery cell 111 may include a rechargeable secondary battery. For example, the battery cell 111 may include a nickel-cadmium battery, a lead storage battery, a nickel metal hydride (NiMH) battery, a lithium ion battery, and a lithium polymer battery, for example.

The batteries 110 may be selectively connected to one another via the module switches 120 in parallel. The batteries 110 may be selectively connected between the first and second nodes N1 and N2 via the module switches 120. The selective connection may be controlled, for example, according to an external control signal. The module switches 120 may be controlled directly by the battery management unit 130. According to another example, the battery management unit 130 may transmit a control command for controlling a short circuit or an open circuit of the module switches 120. A control device (e.g., an analog front end circuit) may receive the control command and may short-circuit or open circuit the module switches 120. The module switches 120 may include, for example, relays or field effect transistor (FET) switches.

The battery management unit 130 detects respective battery voltages V1-Vn of the batteries 110. The battery management unit 130 may be connected to anodes of the batteries 110 and the second node N2 in order to detect the battery voltages V1-Vn of the batteries 110. In the example illustrated in FIG. 1, since the first batteries 110_1 and 110_2 are connected to each other in parallel, the battery voltage V1 of the first battery 110_1 may be substantially the same as the battery voltage V2 of the second battery 110_2. The battery management unit 130 may detect a battery voltage (e.g., V1) for one battery (e.g., 110_1) from among the first batteries 110_1 and 110_2.

Since the second batteries 110_3 through 110_n are electrically insulated from one another, their respective battery voltages V3-Vn may be different from one another. The battery management unit 130 detects the respective battery voltages V3-Vn of the second batteries 110_3 through 110_n.

The battery management unit 130 may include battery voltage detectors for detecting the respective battery voltages V1-Vn of the batteries 110. The battery voltage detectors may include analog-to-digital converters (ADCs) for converting the battery voltages of the batteries 110 to digital signals, via a voltage divider connected between the anodes and cathodes of the batteries 110.

The battery management unit 130 may detect respective battery currents I1-In of the batteries 110. The battery management unit 130 may be connected to current sensors for detecting the battery currents I1-In of the batteries 110.

The first batteries (e.g., batteries 110_1 and 110_2) connected between the first node N1 and the second node N2 may be charged or discharged, and the battery currents I1 and I2 may not be 0. In one embodiment, the battery currents I1 and I2 have positive values during discharging and the battery currents I1 and I2 have negative values during charging, or vice versa.

As shown in FIG. 1, when a plurality of first batteries 110_1 and 110_2 are connected to each other in parallel, the battery current I1 may be the same as the battery current I2. When the battery 110_1 and the battery 110_2 fail in establishing an equilibrium state, the battery current I1 may be different from the battery current I2. The difference between the battery current I1 and the battery current I2 may be generated due to the imbalance between the battery 110_1 and the battery 110_2.

Since second batteries (e.g., batteries 110_3 through 110_n) are insulated from the external terminals 101 and 102 due to opened second module switches (e.g., the module switches 120_3 through 120_n), the battery currents I3-In are substantially 0. The battery management unit 130 may consider the battery currents I3-In as 0, without measuring the battery currents I3-In.

The battery management unit 130 may calculate the system current I, which is emitted or introduced via the external terminals 101 and 102, by accumulating the battery currents I1-In. In the example illustrated in FIG. 1, the battery management unit 130 may calculate the system current I by accumulating only the battery currents I1 and I2 of the first batteries 110_1 and 110_2 connected between the first node N1 and the second node N2. The system current I may be current flowing between the first node N1 and the second node N2. According to another example, the battery management unit 130 may include a current sensor for directly sensing the system current I that flows via the external terminals 101 and 102. The battery management unit 130 may directly measure the system current I via the current sensor.

The battery management unit 130 may detect the battery voltages V1-Vn and the battery currents I1-In of the batteries 110 periodically, for example, at intervals of a predetermined period (e.g., 100 ms).

The battery management unit 130 may determine a timing to connect the second batteries (e.g., batteries 110_3 through 110_n) to the first batteries (e.g., batteries 110_1 and 110_2) in parallel by switching the second module switches (e.g., module switches 120_3 through 120_n) into a short circuit state based on the battery voltages V1-Vn of the batteries 110 and the system current I.

The battery management unit 130 may determine the open circuit voltages of the first batteries 110_1 and 110_2, based on the battery voltages V1 and V2 of the first batteries 110_1 and 110_2 and the system current I. The first batteries 110_1 and 110_2 may be charged or discharged. When the first batteries 110_1 and 110_2 are being charged, states of charge (SOCs) of the first batteries 110_1 and 110_2 increase and the open circuit voltages of the first batteries 110_1 and 110_2 increase. On the other hand, when the first batteries 110_1 and 110_2 are being discharged, the SOCs of the first batteries 110_1 and 110_2 decrease and the open circuit voltages of the first batteries 110_1 and 110_2 also decrease.

For example, the battery management unit 130 may determine that the open circuit voltages of the first batteries 110_1 and 110_2 are a sum of a value proportional to the system current I and the battery voltages V1 and V2. For example, when the battery voltages V1 and V2 are each 48V and the system current I is 10 A, the battery management unit 130 may determine the open circuit voltages of the first batteries 110_1 and 110_2 to be each 49V.

When the battery voltages V1 and V2 are each 48V and the system current I is 20 A, the battery management unit 130 may determine the open circuit voltages of the first batteries 110_1 and 110_2 to be each 50V.

When the battery voltages V1 and V2 are each 48V and the system current I is −10 A, the battery management unit 130 may determine the open circuit voltages of the first batteries 110_1 and 110_2 to be each 47V.

When the battery voltages V1 and V2 are each 48V and the system current I is −20 A, the battery management unit 130 may determine the open circuit voltages of the first batteries 110_1 and 110_2 to be each 46V.

When one (e.g., V3) of the battery voltages (e.g., battery voltages V3-Vn) of the second batteries (e.g., the batteries 110_3 through 110_n) becomes substantially the same as the open circuit voltages of the first batteries 110_1 and 110_2, the battery management unit 130 may switch the module switch 120_3 corresponding to the battery 110_3 to a short circuit state. The battery 110_3 may be connected to the first batteries 110_1 and 110_2 in parallel, and the battery 110_3 may be charged or discharged together with the first batteries 110_1 and 110_2. (Voltages may be considered to be substantially the same when they are exactly equal or when a difference between them is less than a preset threshold value.)

Since the second batteries 110_3 through 110_n are in a state of being charged or discharged (e.g., in an open circuit state) by the second module switches 120_3 through 120_n in an open circuit state, the battery voltages V3-Vn of the second batteries 110_3 through 110_n are open-state voltages of the second batteries 110_3 through 110_n. When an open circuit voltage of the battery 110_3 (e.g., the battery voltage V3), is substantially the same as the open circuit voltages of the first batteries 110_1 and 110_2, the battery 110_3 is in a substantially equilibrium state with the first batteries 110_1 and 110_2. Thus, even at the moment when the module switch 120_3 corresponding to the battery 110_3 is switched into a short circuit state, no in-rush currents are generated between the battery 110_3 and the first batteries 110_1 and 110_2. Accordingly, even when the first batteries 110_1 and 110_2 are being charged or discharged, the battery 110_3 may be stably connected to the first batteries 110_1 and 110_2 in parallel.

The foregoing description is of a method in which the battery 110_3, from among the second batteries 110_3 through 110_n, is connected between the first node N1 and the second node N2. The remaining batteries 110_4 through 110_n, from among the second batteries 110_3 through 110_n, may be connected between the first node N1 and the second node N2 in the same manner in which the battery 110_3 is connected between the first node N1 and the second node N2.

The battery management unit 130 may be configured such that a second battery (e.g., battery 110_3) is not connected between the first node N1 and the second node N2, while at least one first battery (e.g., the batteries 110_1 and 110_2) connected between the first node N1 and the second node N2 is being charged or discharged. In this manner, all of the batteries 110_1 through 110_n may be connected between the first node N1 and the second node N2.

The timing to connect the second batteries 110_3 through 110_n between the first node N1 and the second node N2 is determined based on the battery voltages V1-Vn and the system current I. As a result, no in-rush currents is generated. Thus, to place unbalanced batteries into an equilibrium state, the time to discharge batteries having high open circuit voltages is not needed and electric energy stored in the batteries is not unnecessarily consumed.

After the battery system 100 connects at least one battery between the first node N1 and the second node N2, an operation of the battery system 100 may immediately start using only the at least one battery. The other batteries are connected between the first node N1 and the second node N2 during an operation of the battery system 100 according to the above-described method, without generating an in-rush current.

According to an embodiment, while the first batteries 110_1 and 110_2 are being discharged, the open circuit voltages of the first batteries 110_1 and 110_2 are higher than the battery voltages V1 and V2 of the first batteries 110_1 and 110_2. Due to a voltage drop occurring by internal resistances and discharge currents of the first batteries 110_1 and 110_2, the battery voltages V1 and V2 become lower than the open circuit voltages of the first batteries 110_1 and 110_2.

For example, even when each of the open circuit voltages of the first batteries 110_1 and 110_2 is 50V, each of the first battery voltages V1 and V2 may be 49V if the first batteries 110_1 and 110_2 are being discharged to 10 A, e.g., if the system current I is 10 A. Each of the first battery voltages V1 and V2 may be 48V if the first batteries 110_1 and 110_2 are being discharged to 20 A, e.g., if the system current I is 20 A. The battery management unit 130 may estimate the open circuit voltages of the first batteries 110_1 and 110_2 based on the battery voltages V1 and V2 of the first batteries 110_1 and 110_2 and the system current I.

When each of the battery voltages V1 and V2 of the first batteries 110_1 and 110_2 is lower than the battery voltage V3 of the second battery 110_3 by an estimated value while the first batteries 110_1 and 110_2 are being discharged, the battery management unit 130 may control the second module switch 120_3 to short-circuit. The estimated value may be determined, for example, based on the internal resistance values of the first batteries 110_1 and 110_2 and the system current I.

While the first batteries 110_1 and 110_2 are being charged, the open circuit voltages of the first batteries 110_1 and 110_2 are lower than the battery voltages V1 and V2 of the first batteries 110_1 and 110_2. Due to a voltage drop occurring by internal resistances and charge currents of the first batteries 110_1 and 110_2, the battery voltages V1 and V2 become higher than the open circuit voltages of the first batteries 110_1 and 110_2.

For example, even when each of the open circuit voltages of the first batteries 110_1 and 110_2 is 50V, the first battery voltages V1 and V2 may each be 51V if the first batteries 110_1 and 110_2 are being charged with 10 A, e.g., if the system current I is −10 A. The first battery voltages V1 and V2 may each be 52V if the first batteries 110_1 and 110_2 are being charged with 20 A, e.g., if the system current I is −20 A. The battery management unit 130 may estimate the open circuit voltages of the first batteries 110_1 and 110_2 based on the battery voltages V1 and V2 of the first batteries 110_1 and 110_2 and the system current I.

When the battery voltages V1 and V2 of the first batteries 110_1 and 110_2 are higher than the battery voltage V3 of the second battery 110_3 by an estimated value while the first batteries 110_1 and 110_2 are being charged, the battery management unit 130 may control the second module switch 120_3 to short-circuit. The estimated value may be determined based on, for example, the internal resistance values of the first batteries 110_1 and 110_2 and the system current I.

For example, the estimated value may be determined to be a product of the internal resistance value of the first batteries 110_1 and 110_2 and the system current I. The internal resistance value of the first batteries 110_1 and 110_2 corresponds to an internal resistance value for both of the first batteries 110_1 and 110_2 connected to each other in parallel. The battery management unit 130 may store information about the internal resistance values of the first batteries 110_1 and 110_2.

As in the example of FIG. 1, when the first batteries 110_1 and 110_2 are connected to each other in parallel, an internal resistance value for both of the first batteries 110_1 and 110_2 may be determined as a resistance value when an internal resistance of the first battery 110_1 is connected to that of the first battery 110_2 in parallel. The battery management unit 130 may store information about the respective internal resistance values of the batteries 110_1 through 110_n.

The respective internal resistance values of the batteries 110_1 through 110_n may vary depending on differing degrees of aging of the batteries 110_1 through 110_n. As the batteries 110_1 through 110_n age, the internal resistance values of the batteries 110_1 through 110_n increase.

The battery management unit 130 may determine the internal resistance value of the first batteries 110_1 and 110_2 based on the battery voltages V1 and V2 of the first batteries 110_1 and 110_2 and the system current I. According to an example, the battery management unit 130 may determine the internal resistance value of the first batteries 110_1 and 110_2 based on slope of a variation in the battery voltages V1 and V2 with respect to a variation in the system current I. For example, when the system current I is 10 A, each of the battery voltages V1 and V2 is 49V. When the system current I is 20 A, each of the battery voltages V1 and V2 is 48V. Each of the internal resistance values of the first batteries 110_1 and 110_2 may be determined to be 0.1Ω. The battery management unit 130 may estimate each of the open circuit voltages of the first batteries 110_1 and 110_2 to be 50V using the internal resistance values of the first batteries 110_1 and 110_2.

The battery system 100 may further include a system switch 140 connected between the first node N1 and the external terminal 101. The system switch 140 may be controlled by the battery management unit 130. The battery management unit 130 may short-circuit the system switch 140 to charge or discharge any one of the batteries 110.

The battery management unit 130 may open the system switch 140 when the battery currents I1 and I2, that are respectively emitted from the first batteries 110_1 and 110_2, are greater than a discharge reference value. The discharge reference value may vary depending on respective capacities of the batteries 110_1 and 110_2. The discharge reference value of the battery currents I1 and I2 may be, for example, 300 A.

The battery management unit 130 may open the first module switches 120_1 and 120_2 when the battery currents I1 and I2, that are respectively introduced into the first batteries 110_1 and 110_2 corresponding to the first module switches 120_1 and 120_2, are greater than a charge reference value. The charge reference value may vary depending on respective capacities of the batteries 110_1 and 110_2. The charge reference value of the battery currents I1 and I2 may be, for example, 20 A. The battery currents I1 and I2 may exceed the charge reference value when the first batteries 110_1 and 110_2 become imbalanced and current flowing between the first batteries 110_1 and 110_2 increases. When a significant imbalance (e.g., greater than a predetermined value) occurs between the first batteries 110_1 and 110_2 connected in parallel, the unbalanced batteries are insulated from the other batteries to thereby protect the battery system 100.

When the battery system 100 is initially driven, one of the batteries 110_1 through 110_n may be connected between the first node N1 and the second node N2. The battery management unit 130 may first short-circuit a module switch connected to a battery having a highest or lowest battery voltage.

According to an embodiment, the battery management unit 130 may determine a connection sequence of the batteries 110_1 through 110_n, based on an operation mode of the battery system 100 and the battery voltages V1-Vn of the batteries 110_1 through 110_n. The operation mode of the battery system 100 may be one of a charging mode and a discharging mode. In the charging mode, current is introduced from a charging device to the battery system 100. In the discharging mode, current is output from the battery system 100 toward a load. According to an example, the battery management unit 130 may determine whether to charge or discharge the battery system 100 based on the battery voltages V1-Vn or SOCs of the batteries 110_1 through 110_n.

According to another example, the battery management unit 130 may determine an operation mode based on a control signal transmitted by a charging device connected to the battery system 100. For example, the charging device may be a bidirectional converter connected to the battery system 100. The control signal for controlling operation mode may be received from the bidirectional converter or a general controller connected to the bidirectional converter.

When the operation mode of the battery system 100 is a discharge mode, the battery management unit 130 may first short-circuit a module switch connected to a battery having a highest battery voltage. Since the battery system 100 supplies electrical energy to a load connected to the external terminals 101 and 102 while operating in a discharge mode, the batteries 110 may be connected, between the first node N1 and the second node N2 in parallel, in the order of battery voltages from a battery 110 having a highest battery voltage to a battery 110 having a lowest battery voltage.

When the operation mode of the battery system 100 is a charge mode, the battery management unit 130 may first short-circuit a module switch connected to a battery having a lowest battery voltage. Since the battery system 100 receives electric energy from a charging device connected to the external terminals 101 and 102 while operating in a charge mode, the batteries 110 may be connected, between the first node N1 and the second node N2 in parallel, in the order of battery voltages from the battery 110 having a lowest battery voltage to the battery 110 having a highest battery voltage.

Figure 2:
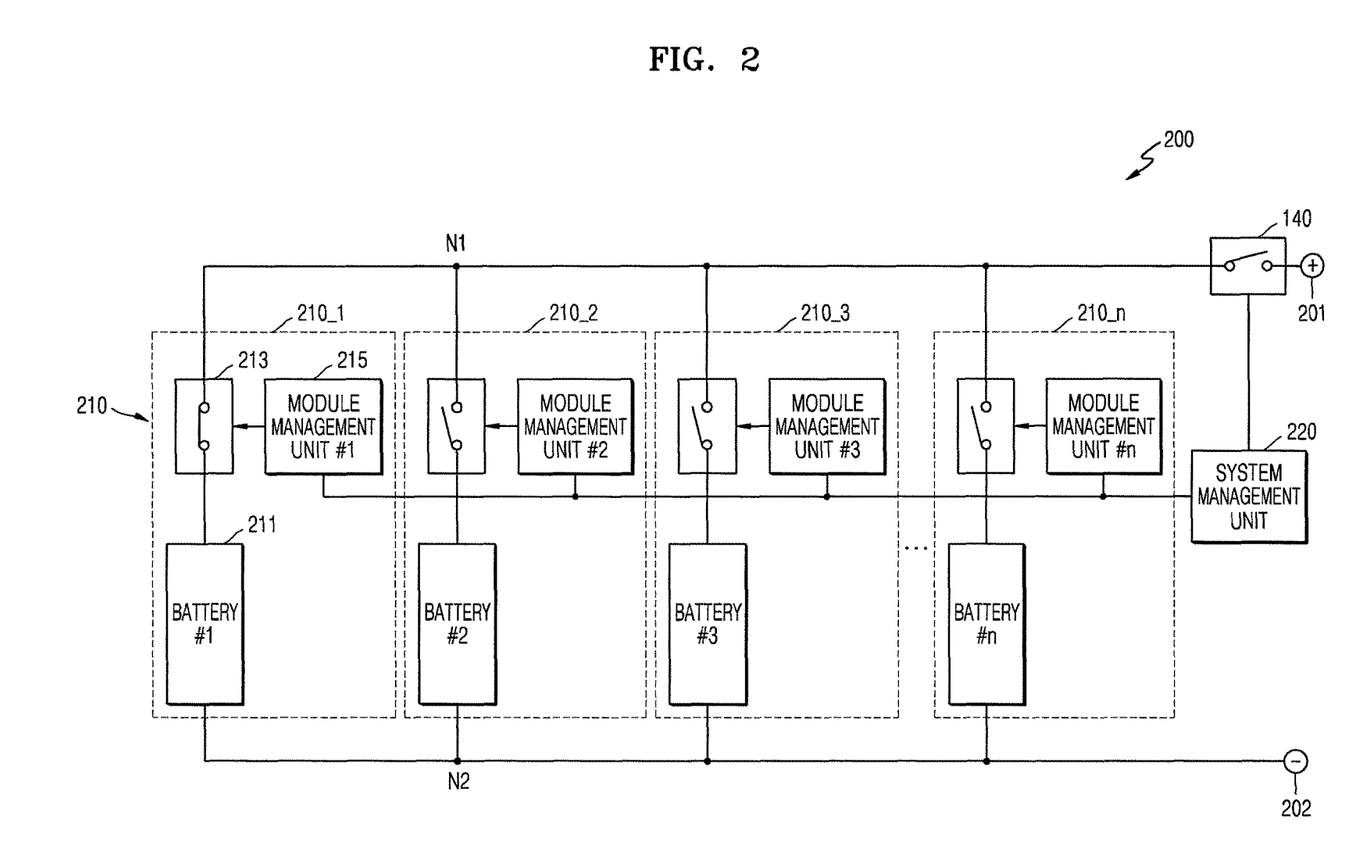
FIG. 2 illustrates another embodiment of a battery system.

FIG. 2 illustrates another embodiment of a battery system 200 which includes battery modules 210 selectively connected to one another in parallel, and a system management unit 220 for managing the battery modules 210. The battery modules 210 include battery modules 210_1 through 210_n.

Each battery module 210 includes a pair of module terminals respectively connected to a first node N1 and a second node N2. Each battery module 210 includes a module switch 213 and a battery 211 serially connected to each other between the first node N1 and the second node N2, and a module management unit 215. The module management unit 215 detects a battery voltage and a battery current of the battery 211, transmits information about the battery voltage and the battery current to the system management unit 220, and switches the module switch 213 under the control of the system management unit 220.

FIG. 2 illustrates an example in which the module switch 213 of the battery module 210_1 is in a short circuit state and the module switches 213 of the battery modules 210_2 through 210_n are in an open circuit state. Battery modules which include short-circuited module switches 213 as the battery module 210_1 may be referred to as first battery modules, and battery modules including opened module switches 213 as the battery modules 210_2 through 210_n may be referred to as second battery modules. The present embodiment relates to a method of connecting the second battery modules to the first battery module in parallel while the first battery module is being charged or discharged. According to the states of the first battery module, the second battery modules are connected to the first battery module in parallel in an order determined according to the states of the second battery modules.

An operation in which a second battery module (e.g., 210_2) is connected to a first battery module (e.g., 210_1) in parallel will be described below. In this manner, all of the second battery modules may be connected to the first battery module in parallel.

The system management unit 220 determines a timing to short-circuit a module switch 213, of at least one remaining second battery module (e.g., 210_2 through 210_n) from among the battery modules 210, based on respective battery voltages and respective battery currents of the battery modules 210, while at least one first battery module (e.g., 210_1) from among the battery modules 210 (e.g., some of the battery modules 210) is being charged or discharged. The system management unit 220 transmits a control command to short-circuit the module switch 213 at the determined timing to the module management unit 215. The module management unit 215 short-circuits the module switch 213 according to the control command.

When unbalanced batteries 211 are connected to one another in parallel, an in-rush current is generated when the unbalanced batteries 211 are connected to one another. According to the present embodiment, the system management unit 220 determines a timing when the batteries 211 are substantially in an equilibrium state. The batteries 211 are connected to one another in parallel at the determined timing. Thus, in-rush currents may be prevented or reduced.

The battery system 200 includes a pair of external terminals 201 and 202 to which a load or a charging device is connectable. The battery system 200 may further include a system switch 140 connected between the first node N1 and the external terminal 201. The system switch 140 may be connected between the second node N2 and the external terminal 202.

The batteries 211 and the module switches 213 respectively correspond to the batteries 110 and the module switches 120 described above with reference to FIG. 1. The system management unit 220 and the module management units 215 may correspond to the battery management unit 130 described above with reference to FIG. 1. In other words, the battery management unit 130 described above with reference to FIG. 1 may include the system management unit 220 and the module management units 215 connected to communicate with one another.

The system management unit 220 may be connected to the module management units 215 via a communication bus. For example, a communication protocol between the system management unit 220 and the module management units 215 may be a controller area network (CAN) communication protocol. In another embodiment, a different communication protocol may be used. The system management unit 220 may be referred to as a rack battery management system (BMS) or a master BMS, and the module management unit 215 may be referred to as a module BMS, a tray BMS, or a slave BMS.

The module management units 215 may measure battery voltages and battery currents of the batteries 211 and transmit information indicative of the measured battery voltages and the measured battery currents to the system management unit 220. The system management unit 220 may receive the information indicative of the battery voltages and the battery currents from the module management units 215.

The system management unit 220 may determine an open circuit voltage of a first battery module, based on information of the battery voltage and/or battery current of the first battery module. When the first battery module is being discharged, the open circuit voltage of the first battery module decreases. When the first battery module is being charged, the open circuit voltage of the first battery module increases. In other words, since the first battery module is being charged or discharged, the open circuit voltage of the first battery module may vary.

The system management unit 220 periodically determines the open circuit voltage of the first battery module. When the open circuit voltage of the first battery module is substantially the same as a battery voltage of the second battery module, the system management unit 220 transmits a control command to short-circuit a module switch of the second battery module to a module management unit of the second battery module. As a result, the second battery module is connected to the first battery module in parallel. The module management unit of the second battery module receives the control command and short-circuits the module switch. As a result, the second battery module is connected to the first battery module in parallel.

According to an example, the system management unit 220 may determine an internal resistance value of the first battery module, based on a ratio of a variation in the battery voltage of the first battery module to a variation in the battery current of the first battery module. The system management unit 220 may determine the open circuit voltage of the first battery module, based on the battery voltage, the battery current, and/or internal resistance value of the first battery module. For example, when the first battery module is being discharged, the system management unit 220 may determine the open circuit voltage to be a sum of a product of the battery current and the internal resistance value of the first battery module and the battery voltage of the first battery module. When the first battery module is being charged, the system management unit 220 may determine the open circuit voltage to be a difference between the product of the battery current and the internal resistance value of the first battery module and the battery voltage of the first battery module.

According to another example, the system management unit 220 may store information representing a relationship between a SOC of the first battery module and its open circuit voltage. After a stabilization time has lapsed after charging and discharging of the first battery module are stopped, the system management unit 220 may determine the battery voltage of the first battery module as the open circuit voltage of the first battery module. The system management unit 220 may determine the SOC of the first battery module based on its open circuit voltage. Thereafter, when the first battery module is charged or discharged, the system management unit 220 adds up the battery current of the first battery module and thus calculates the SOC of the first battery module. The system management unit 220 may estimate the open circuit voltage of the first battery module that is being charged or discharged based on the SOC of the first battery module.

The module management units 215 also measure cell voltages of battery cells in the batteries 211, in addition to the battery voltages and battery currents of the batteries 211. The module management units 214 transmit the measured cell voltages to the system management unit 220. The module management units 215 measure temperatures of the batteries 211 and transmit the measured temperatures to the system management unit 220. The system management unit 220 collects parameters (e.g., cell voltages, charging and discharging currents, and temperatures) of the batteries 211 and determines SOCs and/or states of health (SOHs) of the batteries 211.

The module management units 215 may control the module switches 213. For example, the module management units 215 short-circuit or open the module switches 213. The module switches 213 may include, for example, relays or FETs. The module management units 215 may control the module switches 213 according to a control command transmitted by the system management unit 220.

An embodiment of a method for operating the battery system 200. It is assumed that, before the battery system 200 starts operating, the module switches 213 of the battery modules 210 are open.

The module management units 215 may measure battery voltages and battery currents of the battery modules 210 and transmit the measured battery voltages and the measured battery currents to the system management unit 220. The battery voltage of the battery module 210_1 may be the highest, the battery voltage of the battery module 210_2 may be second highest, the battery voltage of the battery module 210_3 may be third highest, and accordingly the battery voltage of the battery module 210_*n* may be lowest. The battery voltages of the battery modules may be different in another embodiment.

The system management unit 220 may determine whether to charge or discharge the battery modules 210 based on SOCs of the battery modules 210 and/or external environments or parameters. The following may correspond to when the system management unit 220 determines that the system management unit 220 is to be discharged. The system management unit 220 may transmit a switch short-circuit command to the module management unit 215 of the battery module 210_1. The module management unit 215 of the battery module 210_1 may short-circuit the module switch 213 thereof. A current state of the battery system 200 is as shown in FIG. 2.

The system management unit 220 may supply electric energy to an electric load connected to the external terminals 201 and 202 using the battery module 210_1. Since the battery module 210_1 is being discharged, the open circuit voltage of the battery module 210_1 slowly decreases. The module management unit 215 of the battery module 210_1 may periodically measure a battery voltage and a battery current of the battery module 210_1 and transmit periodically-measured battery voltages and battery currents to the system management unit 220.

The system management unit 220 may periodically determine the open circuit voltage of the battery module 210-1 based on the periodically-measured battery voltages and battery currents of the battery module 210-1.

Since the battery module 210_1 is being discharged, a moment when the open circuit voltage of the battery module 210_1 is substantially the same as the battery voltage of the battery module 210_2 may occur. This moment may be different from a moment when the battery voltage of the battery module 210_1 is substantially the same as the battery voltage of the battery module 210_2. According to the present embodiment, the system management unit 220 transmits a control command at the moment when the open circuit voltage of the battery module 210_1 is substantially the same as the battery voltage of the battery module 210_2, not at the moment when the battery voltage of the battery module 210_2 is the same as that of the battery module 210_1. Since the battery module 210_2 is not being charged nor discharged, the battery voltage of the battery module 210_2 may be considered as the open circuit voltage of the battery module 210_2.

The system management unit 220 may sense the moment when the open circuit voltage of the battery module 210_1 is substantially the same as the battery voltage of the battery module 210_2, and may transmit a switch short-circuit command to the module management unit 215 of the battery module 210_2 at this sensed moment. The module management unit 215 of the battery module 210_2 may receive the switch short-circuit command and short-circuit the module switch 213 thereof. Accordingly, the battery module 210_2 is connected to the battery module 210_1 in parallel. The battery voltage of the battery module 210_1 may be the same as the battery voltage of the battery module 210_2. The battery module 210_2 supplies electric energy to the battery module 210_1 and also to the load. (The battery modules 210_1 and 210_2 may be referred to as first battery modules 210_1 and 210_2).

The system management unit 220 may determine the open circuit voltages of the first battery modules 210_1 and 210_2 based on the battery voltages and the battery currents of the first battery modules 210_1 and 210_2. The battery currents of the first battery modules 210_1 and 210_2 may be measured by the system management unit 220, for example, via a current sensor mounted on a high current path within the battery system 200.

Since the first battery modules 210_1 and 210_2 are being discharged, the open circuit voltages of the first battery modules 210_1 and 210_2 gradually decrease, a moment may occur when the open circuit voltage of the first battery modules 210_1 and 210_2 is substantially the same as the battery voltage of the battery module 2103. The system management unit 220 may sense the moment when the open circuit voltages of the first battery modules 210_1 and 210_2 are substantially the same as the battery voltage of the battery module 210_3, and may transmit a switch short-circuit command to the module management unit 215 of the battery module 210_3 at this sensed moment.

The module management unit 215 of the battery module 210_3 may receive the switch short-circuit command and short-circuit the module switch 213 thereof. Accordingly, the battery module 210_3 is connected to the first battery modules 210_1 and 210_2 in parallel, and supplies electrical energy to the first battery modules 210_1 and 210_2 and also to the load. (The battery modules 210_1 through 210_3 may be referred to as first battery modules 210_1 through 210_3). In this way, the battery module 210_*n* is also connected to first battery modules in parallel.

According to the present embodiment, electrical energy stored in the battery modules 210 is not unnecessarily output in order to render the battery modules 210 in an equilibrium state. In addition, since a process of rendering the battery modules 210 in an equilibrium state is achieved during an operation of the battery system 200, the battery system 200 may immediately start operating.

Figure 3:
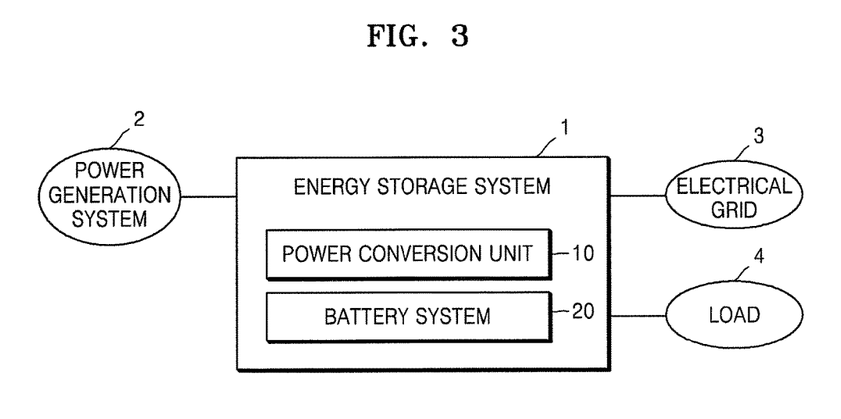
FIG. 3 illustrates an embodiment of an energy storage system.

FIG. 3 illustrates an example of an energy storage system 1 and its surroundings.

Referring to FIG. 3, the energy storage system 1 is linked with a power generation system 2 and an electrical grid 3 and provides electricity to a load 4. The energy storage system 1 includes a battery system 20 that stores electricity and a power conversion system (PCS) 10. The PCS 10 converts electricity supplied from the power generation system 2, the electrical grid 3, and/or the battery system 20 to electricity of a proper type. The converted electricity is supplied to the load 4, the battery system 20, and/or the electrical grid 3.

The power generation system 2 generates electricity from an energy source. The power generation system 2 supplies the generated electricity to the energy storage system 1. The power generation system 2 may include at least one of a sunlight power generation system, a wind power generation system, and a tidal power generation system. For example, the power generation system 2 may include all power generation systems that generate electricity using new and renewable energy, e.g., solar heat or geothermal heat. The power generation system 2 may include a plurality of power generation modules connected in parallel to function, for example, as a large-capacity energy system.

The electrical grid 3 may include power plants, substations, transmission lines, etc. When the electrical grid 3 is in a normal state, the electrical grid 3 may supply electricity to the load 4 and/or the battery system 20 or may receive electricity from the battery system 20 and/or the power generation system 2. When the electrical grid 3 is in an abnormal state, electricity may not be transmitted between the electrical grid 3 and the energy storage system 1.

The load 4 consumes electricity generated by the power generation system 2, stored in the battery system 20 and/or supplied from the electrical grid 3. For example, the load 4 may correspond to electrical devices, for example, in a home or plant including the energy storage system 1.

Electricity generated by the power generation system 2 may be stored in the battery system 20 and/or supplied to the electrical grid 3 by the energy storage system 1. The energy storage system 1 may supply electricity stored in the battery system 20 to the electrical grid 3 or may store electricity from the electrical grid 3 in the battery system 20. In addition, the energy storage system 1 may supply electricity, generated by the power generation system 2 and/or stored in the battery system 20, to the load 4. When the electrical grid 3 is in an abnormal state (e.g., a blackout state), the energy storage system 1 may function as an uninterruptible power supply (UPS) that supplies electricity generated by power generation system 2 or stored in the battery system 20 to a load 4.

Figure 4:
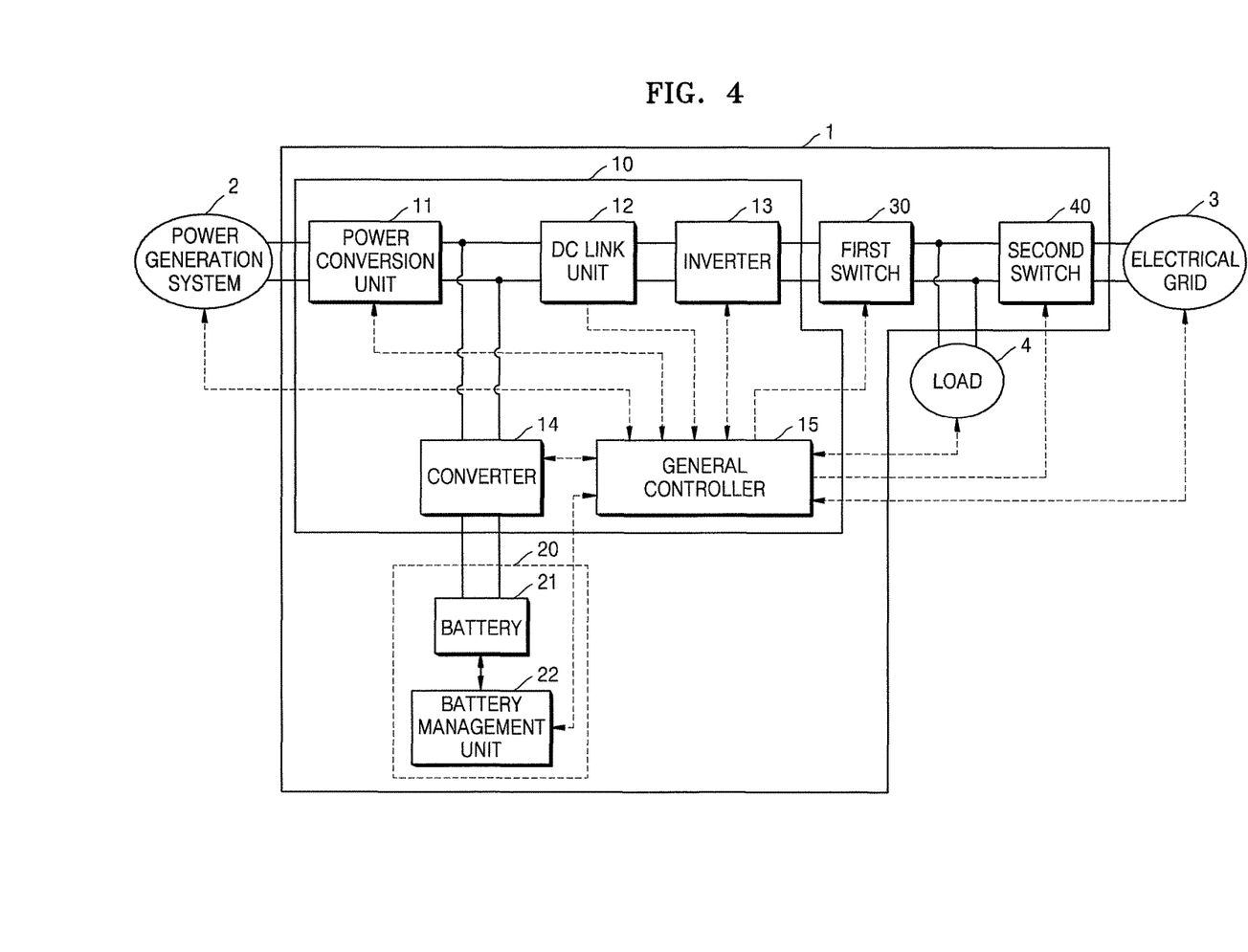
FIG. 4 illustrates a more detailed embodiment of an energy storage system.

FIG. 4 illustrates an example of an energy storage system 1 which includes a power conversion system (PCS) 10 for converting power, a battery system 20, a first switch 30, and a second switch 40. The battery system 20 may include a battery 21 and a battery management unit 22.

The PCS 10 converts electricity supplied from a power generation system 2, an electrical grid 3, and the battery system 20 to electricity of a proper type. The converted electricity is supplied to a load 4, the battery system 20, and/or the electrical grid 3. The PCS 10 includes a power conversion unit 11, a direct current (DC) link unit 12, an inverter 13, a converter 14, and a general controller 15.

The power conversion unit 11 is connected between the power generation system 2 and the DC link unit 12. The power conversion unit 11 converts electricity generated by the power generation system 2 to a DC link voltage. The DC link voltage is applied to the DC link unit 12. According to the type of the power generation system 2, the power conversion unit 11 may include a power conversion circuit such as a converter circuit or a rectifier circuit. For example, if the power generation system 2 generates DC electricity, the power conversion unit 11 may include a DC-DC converter to convert DC electricity generated by the power generation system 2 to DC electricity of a different type. If the power generation system 2 generates alternating current (AC) electricity, the power conversion unit 11 may include a rectifier circuit to convert AC electricity to DC electricity.

In one exemplary embodiment, the power generation system 2 may be a solar power generation system. In this case, the power conversion unit 11 may include a maximum power point tracking (MPPT) converter to maximally receive electricity from the power generation system 2 according to various factors, e.g., the amount of solar radiation or temperature. When the power generation system 2 does not generate electricity, the power conversion unit 11 may not be operated in order to minimize consumption of power by the power conversion circuit, such as a converter circuit or a rectifier circuit.

When a problem occurs (such as an instantaneous voltage drop in the power generation system 2 or the electrical grid 3 or generation of a peak load in the load 4), the level of the DC link voltage may become unstable. However, the DC link voltage may be stabilized in order to achieve normal operations of the convert 14 and the inverter 13. The DC link unit 12 may be connected between the power conversion unit 11, the inverter 13, and the converter 14, and may maintain a constant DC link voltage or a substantially constant DC link voltage. The DC link unit 12 may include, for example, a large-capacity capacitor.

The inverter 13 may be a power converter connected between the DC link unit 12 and the first switch 30. The inverter 13 may include an inverter that converts a DC link voltage provided by at least one of the power generation system 2 and the battery system 20 to an AC voltage of the electrical grid 3 and outputs the AC voltage. To store electricity of the electrical grid 3 in the battery system 20 in a charging mode, the inverter 13 may include a rectifier circuit that converts an AC voltage provided by the electrical grid 3 to a DC link voltage and outputs the DC link voltage. The inverter 13 may be a bidirectional inverter which changes directions of an input and an output.

The inverter 13 may include a filter for removing harmonic waves from the AC voltage output to the electrical grid 3. To suppress or restrict generation of reactive power, the inverter 13 may include a phase locked loop (PLL) circuit for synchronizing the phase of the AC voltage output by the inverter 13 with the phase of the AC voltage of the electrical grid 3. The inverter 13 may perform various functions, e.g., restriction of a voltage variation range, power-factor improvement, removal of a DC component, and protection or reduction of transient phenomena.

The converter 14 may be a power converter connected between the DC link unit 12 and the battery system 20. The converter 14 may include a DC-DC converter that converts power stored in the battery system 20 in a discharging mode to a DC link voltage and outputs the DC link voltage to the inverter 13. The converter 14 may also include a DC-DC converter that converts a DC link voltage output by the power conversion unit 11 and/or the DC link voltage output by the inverter 13 to a DC voltage having an appropriate voltage level (e.g., a charge voltage level required by the battery system 20) and outputs the DC voltage to the battery system 20. The converter 14 may be a bidirectional converter which changes directions of an input and an output. When neither charging nor discharging of the battery system 20 is performed, operation of the converter 14 may be interrupted and thus power consumption may be reduced or minimized.

The general controller 15 monitors the states of the power generation system 2, the electrical grid 3, the battery system 20, and the load 4. For example, the general controller 15 may monitor whether the electrical grid 3 is in a blackout state, whether the power generation system 2 generates electricity, the amount of electricity generated by the power generation system 2, the state of charge (SOC) of the battery system 20, and/or the amount of power consumption or operation time of the load 4.

The general controller 15 controls the power conversion unit 11, the inverter 13, the converter 14, the battery system 20, the first switch 30, and the second switch 40 according to results of monitoring and a preset algorithm. For example, if the electrical grid 3 is in a blackout state, electricity stored in the battery system 20 or generated by the power generation system 2 may be supplied to the load 4 under the control of the general controller 15. If sufficient electricity is not supplied to the load 4, the general controller 15 may determine priorities of the electric devices of the load 4 and may control the load 4 so that electricity is first supplied to higher priority devices. The general controller 15 may control charging and discharging operations of the battery system 20.

The first switch 30 and the second switch 40 are serially connected between the inverter 13 and the electrical grid 3, and control a current flow between the power generation system 2 and the electrical grid 3 by short-circuiting or opening under the control of the general controller 15. Short-circuiting and opening states of the first switch 30 and the second switch 40 may be determined according to the states of the power generation system 2, the electrical grid 3, and/or the battery system 20.

For example, the first switch 30 may be short-circuited when electricity from at least one of the power generation system 2 or the battery system 20 is supplied to the load 4 or electricity from the electrical grid 3 is supplied to the battery system 20. The second switch 40 may be short-circuited when electricity from at least one of the power generation system 2 or the battery system 20 is supplied to the electrical grid 3 or electricity from the electrical grid 3 is supplied to at least one of the load 4 and the battery system 20.

When the electrical grid 3 is in a blackout state, the second switch 40 is in an open circuit state and the first switch 30 is in a short circuit state, e.g., electricity from at least one of the power generation system 2 and the battery system 20 is supplied to the load 4. At the same time, the electricity supplied to the load 4 is prevented from flowing toward the electrical grid 3. As such, by operating the energy storage system 1 as a stand-alone system, a worker working at, for example, the power lines of the electrical grid 3 may be prevented from being injured by electricity received from the power generation system 2 or the battery system 20.

The first switch 30 and the second switch 40 may be, for example, relays or other types of switches capable of enduring and handling large current.

The battery system 20 may receive electricity from at least one of the power generation system 2 and the electrical grid 3, store the received electricity, and supply the stored electricity to at least one of the load 4 or the electrical grid 3. The battery system 20 may, for example, correspond to the battery systems 100 and 200 described above with reference to FIGS. 1 and 2.

The battery system 20 may include a battery 21 including at least one battery cell to store electricity and a battery management unit 22 for controlling and protecting the battery 21. The battery 21 may include sub-batteries that are selectively connected in parallel. The battery 21 may include a plurality of battery racks selectively connected in parallel. In this case, the battery racks may correspond to the sub-batteries. The battery 21 may be a battery rack including a plurality of battery trays or modules selectively connected in parallel. The battery racks or modules may correspond to the sub-batteries. The battery 21 may be a battery tray or module including a plurality of battery racks selectively connected in parallel. In this case, the battery cells may correspond to the sub-batteries.

In one embodiment, a sub-battery connected to an external terminal and charged or discharged (from among a plurality of sub-batteries that are selectively connected in parallel) may be referred to as an active sub-battery. A sub-battery separated from the external terminal may be referred to as an inactive sub-battery.

The sub-batteries may correspond to the batteries 110 described with reference to FIG. 1 or the batteries 211 described with reference to FIG. 2. The battery management unit 22 may correspond to the battery management unit 130 described with reference to FIG. 1 or a combination of the module management units 215 and the system management unit 220 described with reference to FIG. 2.

The battery management unit 22 may be connected to the battery 21 and may control overall operations of the battery system 20 according to a control command from the general controller 15 or an internal algorithm. For example, the battery management unit 22 may perform an overcharge prevention function, an overdischarge prevention function, an overcurrent prevention function, an overvoltage prevention function, an overheat prevention function, and a cell balancing function.

The battery management unit 22 may obtain a voltage, a current, a temperature, a residual electricity amount, a lifespan, and/or an SOC, for example, of the battery 21. For example, the battery management unit 22 may measure a cell voltage, a current, and/or a temperature of the battery 21 using sensors. The battery management unit 22 may calculate the residual electricity amount, the lifespan, and/or the SOC, for example, of the battery 21 based on the measured voltage, the measured current, and/or the measured temperature.

The battery management unit 22 may manage the battery 21 based on a result of the measurement, a result of the calculation, and the like, and may transmit the result of the measurement, the result of the calculation, and the like, to the general controller 15. The battery management unit 22 may control charging and discharging operations of the battery 21 according to charging and discharging control commands from the general controller 15.

The battery management unit 22 may detect a battery voltage of an active sub-battery, a battery voltage of an inactive sub-battery and a system current which is an accumulation of battery currents of the active sub-battery, and may determine an open circuit voltage of the active sub-battery based on the battery voltage of the active sub-battery and the system current. When the open circuit voltage becomes substantially the same as the battery voltage of the inactive sub-battery, the battery management unit 22 may connect the inactive sub-battery between external terminals such that the inactive sub-battery is connected to the active sub-battery in parallel.

The battery management unit 22 may determine a timing to connect the inactive sub-battery to the active sub-battery in parallel based on respective battery voltages and respective battery currents of sub-batteries while the active sub-battery is being charged or discharged.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The battery management units, module management units, controllers, converters, and other processing features of the embodiments described herein may be implemented in logic which, for example, may include hardware, software, or both. When implemented at least partially in hardware, the battery management units, module management units, controllers, converters, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the battery management units, module management units, controllers, converters, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

By way of summation and review, a relatively large-capacity battery system may be formed by connecting a plurality of battery modules to one another in parallel. When battery modules are connected to one another in parallel, an in-rush current may be generated as a result of voltage differences among the battery modules. The in-rush current may cause the battery modules or an energy storage system to break or malfunction.

In accordance with one or more of the aforementioned embodiments, a large-capacity battery system including battery modules connected in parallel determines a timing to additionally connect a second battery module to first battery modules that have already been connected in parallel and are being charged or discharged. This determination may be made based on not only voltages of the first battery modules and a voltage of the second battery module, but also based on charging or discharging current of the first battery modules. As a result, an in-rush current may be reduced or prevented from being generated between the first battery modules and the second battery module.

Also, while all of the battery modules are connected in parallel, electrical energy may be used by a load or stored in the battery modules. Thus, there is no unnecessarily consumed electrical energy and energy efficiency is thereby improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present embodiments as set forth in the following claims.

What is claimed is:

1. A battery system, comprising:
   a first battery electrically connected between a first node and a second node via a first module switch in a short circuit state;
   a second battery electrically insulated from the first battery by a second module switch in an open circuit state; and
   a battery manager to detect a first battery voltage of the first battery, a second battery voltage of the second battery, and a system current flowing between the first and second nodes, to determine an open circuit voltage of the first battery based on the first battery voltage and the system current, and to short-circuit the second module switch when the open circuit voltage is substantially equal to the second battery voltage so that the second battery is connected to the first battery in parallel.

2. The battery system as claimed in claim 1, wherein the battery manager is to connect the second battery to the first battery in parallel while the first battery is being charged or discharged.

3. The battery system as claimed in claim 1, wherein:
   when the first battery is being discharged, the battery manager is to control the second module switch to short-circuit when the first battery voltage is lower than the second battery voltage by an estimated value.

4. The battery system as claimed in claim 1, wherein:
   when the first battery is being charged, the battery manager is to control the second module switch to short-circuit when the first battery voltage is higher than the second battery voltage by an estimated value.

5. The battery system as claimed in claim 3, wherein the battery manager is to:
   store information corresponding to an internal resistance value of the first battery, and
   determine the estimated value to be a product of the system current and the internal resistance value of the first battery.

6. The battery system as claimed in claim 1, wherein the battery manager is to estimate the open circuit voltage of the first battery based on a rate of change of a variation in the first battery voltage with respect to a variation in the system current.

7. The battery system as claimed in claim 1, further comprising:
a system switch connected between the first node and an external terminal, wherein the battery manager is to open the system switch when a discharge current discharged from the first battery is greater than a discharge reference value and is to open the first module switch when a charge current introduced into the first battery is greater than a charge reference value.

8. A battery system, comprising:
a plurality of battery modules selectively connected to one another in parallel; and
a system manager to manage the battery modules, wherein each of the battery modules includes:
a module switch serially connected to a battery between a pair of module terminals, and
a module manager to detect a battery voltage and a battery current of the battery, to transmit information corresponding to the battery voltage and the battery current to the system manager, and to switch the module switch under control of the system manager, and
wherein the system manager is to determine a timing to short-circuit a module switch of at least one remaining second battery module from among the battery modules based on the battery voltage and the battery current of each of the battery modules, while at least one first battery module from among the battery modules is being charged or discharged.

9. The battery system as claimed in claim 8, wherein the system manager is to:
determine an open circuit voltage of the at least one first battery module based on the battery voltage and the battery current of the at least one first battery module, and
transmit a switch short-circuit command to a module management unit of the at least one second battery module when the open circuit voltage is substantially equal to the battery voltage of the at least one second battery module.

10. The battery system as claimed in claim 9, wherein the system manager is to:
determine an internal resistance value of the at least one first battery module based on a ratio of a variation in the battery voltage of the at least one first battery module to a variation in the battery current of the at least one first battery module, and
determine the open circuit voltage of the at least one first battery module based on the battery voltage, the battery current, and the internal resistance value of the at least one first battery module.

11. The battery system as claimed in claim 10, wherein:
while the at least one first battery module is being discharged, the system manager is to determine the open circuit voltage by adding a product of the battery current and the internal resistance value of the at least one first battery module to the battery voltage of the at least one first battery module, and
while the at least one first battery module is being charged, the system manager is to determine the open circuit voltage by subtracting the product of the battery current and the internal resistance value of the at least one first battery module from the battery voltage of the at least one first battery module.

12. The battery system as claimed in claim 9, wherein the system manager is to:
store information corresponding to a relationship between a state of charge (SOC) of the at least one first battery module and the open circuit voltage of the at least one first battery module,
calculate the SOC of the at least one first battery module by accumulating the battery current of the at least one first battery module, and
estimate the open circuit voltage of the at least one first battery module based on the SOC of the at least one first battery module.

13. An apparatus, comprising:
a detector to detect a first battery voltage of a first battery, a second battery voltage of a second battery, and current flowing between first and second nodes, the first battery connected between a first node and a second node when a first module switch is in a short circuit state, the second battery electrically insulated from the first battery when a second module switch is in an open circuit state; and
a battery manager to determine an open circuit voltage of the first battery based on the first battery voltage and the current and to short-circuit the second module switch when the open circuit voltage is substantially equal to the second battery voltage to connect the second battery to the first battery in parallel.

14. The apparatus as claimed in claim 13, wherein the battery manager is to connect the second battery to the first battery in parallel while the first battery is being charged or discharged.

15. The apparatus as claimed in claim 13, wherein the battery manager is to control the second module switch to short-circuit when the first battery voltage is lower than the second battery voltage by an estimated value during a time when the first battery is being discharged.

16. The apparatus as claimed in claim 13, wherein the battery manager is to control the second module switch to short-circuit when the first battery voltage is higher than the second battery voltage by an estimated value during a time when the first battery is being charged.

17. The apparatus as claimed in claim 16, wherein the battery manager is to:
store information corresponding to an internal resistance value of the first battery, and
determine the estimated value to be a product of the system current and the internal resistance value of the first battery.

* * * * *